US009748391B2

(12) United States Patent
Chau et al.

(10) Patent No.: US 9,748,391 B2
(45) Date of Patent: Aug. 29, 2017

(54) FIELD EFFECT TRANSISTOR WITH NARROW BANDGAP SOURCE AND DRAIN REGIONS AND METHOD OF FABRICATION

(71) Applicant: Intel Corporation, Santa Clara, CA (US)

(72) Inventors: Robert S. Chau, Beaverton, OR (US); Suman Datta, Beaverton, OR (US); Jack Kavalieros, Portland, OR (US); Justin K. Brask, Portland, OR (US); Mark L. Doczy, Portland, OR (US); Matthew Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/442,087

(22) Filed: Feb. 24, 2017

(65) Prior Publication Data

US 2017/0170318 A1 Jun. 15, 2017

Related U.S. Application Data

(60) Continuation of application No. 15/179,884, filed on Jun. 10, 2016, now Pat. No. 9,614,083, which is a
(Continued)

(51) Int. Cl.
*H01L 29/66* (2006.01)
*H01L 29/78* (2006.01)
(Continued)

(52) U.S. Cl.
CPC ...... *H01L 29/7848* (2013.01); *H01L 29/0847* (2013.01); *H01L 29/207* (2013.01);
(Continued)

(58) Field of Classification Search
CPC .......... H01L 29/2003; H01L 29/66462; H01L 29/7787; H01L 29/7783; H01L 29/802
(Continued)

(56) References Cited

U.S. PATENT DOCUMENTS 3,387,820 A   6/1968 Sanderfer et al.
4,231,149 A   11/1980 Chapman
(Continued)

FOREIGN PATENT DOCUMENTS

EP    0510667        10/1992
EP    1 091 413 A2    4/2001
(Continued)

OTHER PUBLICATIONS

Breed, A., et al., "Dual-gat (FinFET) and tri-gate MOSFETs: simulation and design", Semiconductor Device Research Symposium, 2003 International, Dec. 10-12, 2003, pp. 150-151.
(Continued)

*Primary Examiner* — Jami M Valentine
(74) *Attorney, Agent, or Firm* — Schwabe, Williamson & Wyatt P.C.

(57) ABSTRACT

A transistor having a narrow bandgap semiconductor source/drain region is described. The transistor includes a gate electrode formed on a gate dielectric layer formed on a silicon layer. A pair of source/drain regions are formed on opposite sides of the gate electrode wherein said pair of source/drain regions comprise a narrow bandgap semiconductor film formed in the silicon layer on opposite sides of the gate electrode.

20 Claims, 7 Drawing Sheets

Related U.S. Application Data continuation of application No. 14/702,608, filed on May 1, 2015, now Pat. No. 9,368,583, which is a continuation of application No. 14/465,636, filed on Aug. 21, 2014, now Pat. No. 9,048,314, which is a continuation of application No. 14/137,804, filed on Dec. 20, 2013, now Pat. No. 8,816,394, which is a continuation of application No. 13/752,272, filed on Jan. 28, 2013, now Pat. No. 8,664,694, which is a continuation of application No. 13/453,403, filed on Apr. 23, 2012, now Pat. No. 8,368,135, which is a continuation of application No. 13/021,640, filed on Feb. 4, 2011, now Pat. No. 8,183,646, which is a division of application No. 12/850,582, filed on Aug. 4, 2010, now Pat. No. 7,893,506, which is a continuation of application No. 12/343,400, filed on Dec. 23, 2008, now Pat. No. 7,825,481, which is a division of application No. 11/064,996, filed on Feb. 23, 2005, now Pat. No. 7,518,196.

(51) Int. Cl.
*H01L 29/267* (2006.01)
*H01L 29/45* (2006.01)
*H01L 29/207* (2006.01)
*H01L 29/51* (2006.01)
*H01L 29/08* (2006.01)
*H01L 29/16* (2006.01)

(52) U.S. Cl.
CPC .......... *H01L 29/267* (2013.01); *H01L 29/452* (2013.01); *H01L 29/517* (2013.01); *H01L 29/66522* (2013.01); *H01L 29/66636* (2013.01); *H01L 29/7836* (2013.01); *H01L 29/16* (2013.01)

(58) Field of Classification Search
USPC .......................... 257/192, 366, 401; 438/471
See application file for complete search history.

(56) References Cited

U.S. PATENT DOCUMENTS

| | | | |
|---|---|---|---|
| 4,711,701 A | 12/1987 | McLevige | |
| 4,833,103 A | 5/1989 | Agostinelli | |
| 4,905,063 A | 2/1990 | Beltram | |
| 5,023,203 A | 6/1991 | Choi | |
| 5,120,666 A | 6/1992 | Gotou | |
| 5,179,037 A | 1/1993 | Seabaugh | |
| 5,216,271 A | 6/1993 | Takagi | |
| 5,218,213 A | 6/1993 | Gaul et al. | |
| 5,272,358 A * | 12/1993 | Nishino ................ H01L 39/228 257/34 | |
| 5,278,012 A | 1/1994 | Yamanaka et al. | |
| 5,278,102 A | 1/1994 | Horie | |
| 5,308,999 A | 5/1994 | Gotou | |
| 5,328,810 A | 7/1994 | Lowrey et al. | |
| 5,346,839 A | 9/1994 | Sundaresan | |
| 5,357,119 A | 10/1994 | Wang et al. | |
| 5,428,237 A | 6/1995 | Yuzurihara et al. | |
| 5,466,621 A | 11/1995 | Hisamoto et al. | |
| 5,475,869 A | 12/1995 | Gomi et al. | |
| 5,479,033 A | 12/1995 | Baca et al. | |
| 5,482,877 A | 1/1996 | Rhee | |
| 5,514,885 A | 5/1996 | Myrick | |
| 5,539,229 A | 7/1996 | Noble, Jr et al. | |
| 5,554,870 A | 9/1996 | Fitch et al. | |
| 5,576,227 A | 11/1996 | Hsu | |
| 5,595,919 A | 1/1997 | Pan | |
| 5,595,941 A | 1/1997 | Okamoto et al. | |
| 5,652,454 A | 7/1997 | Iwamatsu et al. | |
| 5,665,203 A | 9/1997 | Lee et al. | |
| 5,682,048 A | 10/1997 | Shinohara et al. | |
| 5,698,869 A | 12/1997 | Yoshimi | |
| 5,770,513 A | 6/1998 | Okaniwa | |
| 5,776,821 A | 7/1998 | Haskell et al. | |
| 5,793,088 A | 8/1998 | Choi et al. | |
| 5,811,324 A | 9/1998 | Yang | |
| 5,856,225 A | 1/1999 | Lee et al. | |
| 5,859,456 A | 1/1999 | Efland et al. | |
| 5,936,278 A | 8/1999 | Hu et al. | |
| 5,965,914 A | 10/1999 | Miyamoto | |
| 5,976,767 A | 11/1999 | Li | |
| 5,985,726 A | 11/1999 | Yu et al. | |
| 6,031,249 A | 2/2000 | Yamazaki et al. | |
| 6,063,675 A | 5/2000 | Rodder | |
| 6,063,677 A | 5/2000 | Rodder et al. | |
| 6,114,201 A | 9/2000 | Wu | |
| 6,114,206 A | 9/2000 | Yu | |
| 6,120,846 A | 9/2000 | Hintermaier et al. | |
| 6,130,123 A | 10/2000 | Liang et al. | |
| 6,144,072 A | 11/2000 | Iwamatsu et al. | |
| 6,150,222 A | 11/2000 | Gardner et al. | |
| 6,159,808 A | 12/2000 | Chuang | |
| 6,174,820 B1 | 1/2001 | Habermehl et al. | |
| 6,190,975 B1 | 2/2001 | Kubo et al. | |
| 6,200,865 B1 | 3/2001 | Gardner et al. | |
| 6,251,751 B1 | 6/2001 | Chu et al. | |
| 6,259,135 B1 | 7/2001 | Hsu et al. | |
| 6,262,456 B1 | 7/2001 | Yu et al. | |
| 6,268,640 B1 | 7/2001 | Park et al. | |
| 6,274,503 B1 | 8/2001 | Hsieh | |
| 6,287,924 B1 | 9/2001 | Chau et al. | |
| 6,307,235 B1 | 10/2001 | Forbes et al. | |
| 6,310,367 B1 | 10/2001 | Yagishita et al. | |
| 6,317,444 B1 | 11/2001 | Chakrabarti | |
| 6,319,807 B1 | 11/2001 | Yeh et al. | |
| 6,323,525 B1 * | 11/2001 | Noguchi ............. H01L 21/2257 257/344 | |
| 6,362,111 B1 | 3/2002 | Laaksonen et al. | |
| 6,368,923 B1 | 4/2002 | Huang | |
| 6,383,882 B1 | 5/2002 | Lee et al. | |
| 6,387,820 B1 | 5/2002 | Sanderfer | |
| 6,396,108 B1 | 5/2002 | Krivokapic et al. | |
| 6,399,970 B2 | 6/2002 | Kubo et al. | |
| 6,403,434 B1 | 6/2002 | Yu | |
| 6,403,981 B1 | 6/2002 | Yu | |
| 6,410,371 B1 | 6/2002 | Yu et al. | |
| 6,458,662 B1 | 10/2002 | Yu | |
| 6,465,290 B1 | 10/2002 | Suguro et al. | |
| 6,479,866 B1 | 11/2002 | Xiang | |
| 6,483,146 B2 | 11/2002 | Lee | |
| 6,483,151 B2 | 11/2002 | Wakabayashi et al. | |
| 6,495,403 B1 | 12/2002 | Skotnicki et al. | |
| 6,500,767 B2 | 12/2002 | Chiou et al. | |
| 6,501,141 B1 | 12/2002 | Leu | |
| 6,515,339 B2 | 2/2003 | Shin et al. | |
| 6,525,403 B2 | 2/2003 | Inaba et al. | |
| 6,526,996 B1 | 3/2003 | Chang et al. | |
| 6,537,862 B2 | 3/2003 | Song | |
| 6,555,879 B1 | 4/2003 | Krivokapic et al. | |
| 6,566,734 B2 | 5/2003 | Sugihara et al. | |
| 6,642,114 B2 | 11/2003 | Nakamura | |
| 6,645,861 B2 | 11/2003 | Cabral, Jr. | |
| 6,677,212 B1 | 1/2004 | Yoshioka et al. | |
| 6,686,231 B1 | 2/2004 | Ahmed et al. | |
| 6,716,686 B1 | 4/2004 | Buynoski et al. | |
| 6,762,469 B2 | 7/2004 | Mocuta et al. | |
| 6,780,694 B2 | 8/2004 | Doris et al. | |
| 6,784,071 B2 | 8/2004 | Chen et al. | |
| 6,784,076 B2 | 8/2004 | Gonzalez et al. | |
| 6,787,406 B1 | 9/2004 | Hill et al. | |
| 6,830,998 B1 | 12/2004 | Pan et al. | |
| 6,831,310 B1 | 12/2004 | Matthew et al. | |
| 6,849,556 B2 | 2/2005 | Takahashi | |
| 6,855,588 B1 | 2/2005 | Liao et al. | |
| 6,858,472 B2 | 2/2005 | Schoenfeld | |
| 6,864,519 B2 | 3/2005 | Yeo et al. | |
| 6,864,540 B1 | 3/2005 | Divakaruni et al. | |
| 6,869,898 B2 | 3/2005 | Inaki et al. | |
| 6,870,226 B2 | 3/2005 | Maeda et al. | |

(56) References Cited

U.S. PATENT DOCUMENTS

| | | |
|---|---|---|
| 6,872,643 B1 | 3/2005 | Halliyal et al. |
| 6,881,635 B1 | 4/2005 | Chidambarrao et al. |
| 6,888,199 B2 | 5/2005 | Nowak et al. |
| 6,890,811 B2 | 5/2005 | Hou et al. |
| 6,891,234 B1 | 5/2005 | Connelly et al. |
| 6,902,947 B2 | 6/2005 | Chinn et al. |
| 6,902,962 B2 | 6/2005 | Yeo et al. |
| 6,909,147 B2 | 6/2005 | Aller et al. |
| 6,909,151 B2 | 6/2005 | Hareland et al. |
| 6,919,238 B2 | 7/2005 | Bohr |
| 6,946,377 B2 | 9/2005 | Chambers |
| 6,949,443 B2 | 9/2005 | Ke et al. |
| 6,955,961 B1 | 10/2005 | Chung |
| 6,955,969 B2 | 10/2005 | Djomehri et al. |
| 6,956,281 B2 | 10/2005 | Smith et al. |
| 6,969,878 B2 | 11/2005 | Coronel et al. |
| 6,970,373 B2 | 11/2005 | Datta et al. |
| 6,975,014 B1 | 12/2005 | Krivokapic et al. |
| 6,977,415 B2 | 12/2005 | Matsuo |
| 6,982,433 B2 | 1/2006 | Hoffman et al. |
| 6,998,301 B1 | 2/2006 | Yu et al. |
| 6,998,318 B2 | 2/2006 | Park |
| 7,005,366 B2 | 2/2006 | Chau et al. |
| 7,013,447 B2 | 3/2006 | Mathew et al. |
| 7,045,407 B2 | 5/2006 | Keating et al. |
| 7,045,441 B2 | 5/2006 | Chang et al. |
| 7,045,451 B2 | 5/2006 | Shenai-Khatkhate |
| 7,049,654 B2 | 5/2006 | Chang |
| 7,056,794 B2 | 6/2006 | Ku et al. |
| 7,074,656 B2 | 7/2006 | Yeo |
| 7,074,662 B2 | 7/2006 | Lee et al. |
| 7,084,018 B1 | 8/2006 | Ahmed et al. |
| 7,105,390 B2 | 9/2006 | Brask et al. |
| 7,105,894 B2 | 9/2006 | Yeo et al. |
| 7,105,934 B2 | 9/2006 | Anderson et al. |
| 7,115,945 B2 | 10/2006 | Lee et al. |
| 7,115,954 B2 | 10/2006 | Shimizu et al. |
| 7,119,402 B2 | 10/2006 | Kinoshita et al. |
| 7,132,360 B2 | 11/2006 | Schaefer et al. |
| 7,138,320 B2 | 11/2006 | Bentum et al. |
| 7,141,480 B2 | 11/2006 | Adam et al. |
| 7,163,898 B2 | 1/2007 | Mariani et al. |
| 7,172,943 B2 | 2/2007 | Yeo et al. |
| 7,196,372 B1 | 3/2007 | Yu et al. |
| 7,214,991 B2 | 5/2007 | Yeo et al. |
| 7,247,547 B2 | 7/2007 | Zhu et al. |
| 7,247,578 B2 | 7/2007 | Brask |
| 7,250,367 B2 | 7/2007 | Vaartstra et al. |
| 7,250,655 B2 | 7/2007 | Bae et al. |
| 7,256,455 B2 | 8/2007 | Ahmed et al. |
| 7,268,024 B2 | 9/2007 | Yeo et al. |
| 7,268,058 B2 | 9/2007 | Chau et al. |
| 7,291,886 B2 | 11/2007 | Doris et al. |
| 7,297,600 B2 | 11/2007 | Oh et al. |
| 7,304,336 B2 | 12/2007 | Cheng et al. |
| 7,323,710 B2 | 1/2008 | Kim et al. |
| 7,326,634 B2 | 2/2008 | Lindert et al. |
| 7,329,913 B2 | 2/2008 | Brask et al. |
| 7,339,241 B2 | 3/2008 | Orlowski et al. |
| 7,341,902 B2 | 3/2008 | Anderson et al. |
| 7,348,284 B2 | 3/2008 | Doyle et al. |
| 7,348,642 B2 | 3/2008 | Nowak |
| 7,354,817 B2 | 4/2008 | Watanabe et al. |
| 7,358,121 B2 | 4/2008 | Chau et al. |
| 7,385,262 B2 | 6/2008 | O'Keefee et al. |
| 7,388,259 B2 | 6/2008 | Doris et al. |
| 7,396,730 B2 | 7/2008 | Li |
| 7,439,120 B2 | 10/2008 | Pei |
| 7,452,778 B2 | 11/2008 | Chen et al. |
| 7,456,471 B2 | 11/2008 | Anderson et al. |
| 7,456,476 B2 | 11/2008 | Hareland et al. |
| 7,479,421 B2 | 1/2009 | Kavalieros et al. |
| 7,585,734 B2 | 9/2009 | Kang et al. |
| 7,589,995 B2 | 9/2009 | Tang |
| 7,612,416 B2 | 11/2009 | Takeuchi et al. |
| 7,655,989 B2 | 2/2010 | Zhu et al. |
| 7,701,018 B2 | 4/2010 | Yamagami et al. |
| 8,581,258 B2 | 11/2013 | Brask et al. |
| 8,933,458 B2 | 1/2015 | Brask et al. |
| 2001/0019886 A1 | 9/2001 | Bruce et al. |
| 2001/0026985 A1 | 10/2001 | Kim |
| 2001/0040907 A1 | 11/2001 | Chakrabarti |
| 2002/0037619 A1 | 3/2002 | Sugihara et al. |
| 2002/0043691 A1* | 4/2002 | Higashi .............. H01L 29/4908 257/368 |
| 2002/0048918 A1 | 4/2002 | Grider et al. |
| 2002/0058374 A1 | 5/2002 | Kim |
| 2002/0074614 A1 | 6/2002 | Furuta et al. |
| 2002/0081794 A1 | 6/2002 | Ito |
| 2002/0096724 A1 | 7/2002 | Liang et al. |
| 2002/0142529 A1 | 10/2002 | Matsuda et al. |
| 2002/0149031 A1 | 10/2002 | Kim et al. |
| 2002/0160553 A1 | 10/2002 | Yamanaka et al. |
| 2002/0166838 A1 | 11/2002 | Nagarajan |
| 2002/0177263 A1 | 11/2002 | Hanafi et al. |
| 2002/0177282 A1 | 11/2002 | Song |
| 2003/0036290 A1 | 2/2003 | Hsieh et al. |
| 2003/0042542 A1 | 3/2003 | Maegawa et al. |
| 2003/0057477 A1 | 3/2003 | Hergenrother et al. |
| 2003/0067017 A1 | 4/2003 | Ieong et al. |
| 2003/0085194 A1 | 5/2003 | Hopkins, Jr. |
| 2003/0098479 A1 | 5/2003 | Murthy et al. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0151077 A1 | 8/2003 | Mathew et al. |
| 2003/0174534 A1 | 9/2003 | Clark et al. |
| 2003/0186167 A1 | 10/2003 | Johnson, Jr. et al. |
| 2003/0190766 A1 | 10/2003 | Gonzalez et al. |
| 2003/0201458 A1 | 10/2003 | Clark et al. |
| 2003/0203636 A1 | 10/2003 | Anthony |
| 2003/0232478 A1* | 12/2003 | Hiratsuka ......... H01L 29/66318 438/312 |
| 2004/0016968 A1 | 1/2004 | Coronel et al. |
| 2004/0029323 A1 | 2/2004 | Shimizu et al. |
| 2004/0029345 A1 | 2/2004 | Deleonibus et al. |
| 2004/0029393 A1 | 2/2004 | Ying et al. |
| 2004/0033639 A1 | 2/2004 | Chinn et al. |
| 2004/0036126 A1 | 2/2004 | Chau et al. |
| 2004/0036127 A1 | 2/2004 | Chau et al. |
| 2004/0038436 A1 | 2/2004 | Mori et al. |
| 2004/0038533 A1 | 2/2004 | Liang |
| 2004/0061178 A1 | 4/2004 | Lin et al. |
| 2004/0063286 A1 | 4/2004 | Kim et al. |
| 2004/0070020 A1 | 4/2004 | Fujiwara et al. |
| 2004/0075149 A1 | 4/2004 | Fitzgerald et al. |
| 2004/0082125 A1 | 4/2004 | Hou et al. |
| 2004/0094807 A1 | 5/2004 | Chau et al. |
| 2004/0099903 A1 | 5/2004 | Yeo et al. |
| 2004/0099966 A1* | 5/2004 | Chau .................. H01L 29/458 257/314 |
| 2004/0108523 A1 | 6/2004 | Chen et al. |
| 2004/0108558 A1 | 6/2004 | Kwak et al. |
| 2004/0110097 A1 | 6/2004 | Ahmed et al. |
| 2004/0113181 A1 | 6/2004 | Wicker |
| 2004/0124492 A1 | 7/2004 | Matsuo |
| 2004/0126975 A1 | 7/2004 | Ahmed et al. |
| 2004/0132236 A1 | 7/2004 | Doris et al. |
| 2004/0132567 A1 | 7/2004 | Schonnenbeck |
| 2004/0145000 A1 | 7/2004 | An et al. |
| 2004/0145019 A1 | 7/2004 | Dakshina-Murthy et al. |
| 2004/0169221 A1 | 9/2004 | Ko et al. |
| 2004/0169269 A1 | 9/2004 | Yeo et al. |
| 2004/0173815 A1 | 9/2004 | Yeo et al. |
| 2004/0173846 A1 | 9/2004 | Hergenrother et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0197975 A1 | 10/2004 | Krivokapic et al. |
| 2004/0198003 A1 | 10/2004 | Yeo et al. |
| 2004/0203254 A1 | 10/2004 | Conley et al. |
| 2004/0209463 A1 | 10/2004 | Kim et al. |
| 2004/0217420 A1 | 11/2004 | Yeo et al. |
| 2004/0219722 A1 | 11/2004 | Pham et al. |

(56) References Cited

U.S. PATENT DOCUMENTS

| | | |
|---|---|---|
| 2004/0222473 A1 | 11/2004 | Risaki |
| 2004/0227187 A1 | 11/2004 | Cheng et al. |
| 2004/0238887 A1 | 12/2004 | Nihey |
| 2004/0238915 A1 | 12/2004 | Chen et al. |
| 2004/0253792 A1 | 12/2004 | Cohen et al. |
| 2004/0262683 A1 | 12/2004 | Bohr et al. |
| 2005/0017377 A1 | 1/2005 | Joshi et al. |
| 2005/0019993 A1 | 1/2005 | Lee |
| 2005/0020020 A1 | 1/2005 | Collaert et al. |
| 2005/0035391 A1 | 2/2005 | Lee et al. |
| 2005/0035415 A1 | 2/2005 | Yeo et al. |
| 2005/0040444 A1 | 2/2005 | Cohen |
| 2005/0059214 A1 | 3/2005 | Cheng et al. |
| 2005/0073060 A1 | 4/2005 | Datta et al. |
| 2005/0093028 A1 | 5/2005 | Chambers |
| 2005/0093067 A1 | 5/2005 | Yeo et al. |
| 2005/0093075 A1 | 5/2005 | Bentum et al. |
| 2005/0093154 A1 | 5/2005 | Kottantharayil et al. |
| 2005/0104055 A1 | 5/2005 | Kwak et al. |
| 2005/0104096 A1 | 5/2005 | Lee et al. |
| 2005/0110082 A1 | 5/2005 | Cheng et al. |
| 2005/0116218 A1 | 6/2005 | Yang |
| 2005/0116289 A1 | 6/2005 | Boyd et al. |
| 2005/0127362 A1 | 6/2005 | Zhang et al. |
| 2005/0127632 A1 | 6/2005 | Gehre |
| 2005/0133829 A1 | 6/2005 | Kunii et al. |
| 2005/0133866 A1 | 6/2005 | Chau |
| 2005/0136584 A1 | 6/2005 | Boyanov et al. |
| 2005/0139860 A1 | 6/2005 | Snyder et al. |
| 2005/0145894 A1 | 7/2005 | Chau et al. |
| 2005/0145941 A1 | 7/2005 | Bedell et al. |
| 2005/0145944 A1 | 7/2005 | Murthy et al. |
| 2005/0148131 A1 | 7/2005 | Brask |
| 2005/0148137 A1 | 7/2005 | Brask et al. |
| 2005/0153494 A1 | 7/2005 | Ku et al. |
| 2005/0156171 A1 | 7/2005 | Brask et al. |
| 2005/0156202 A1 | 7/2005 | Rhee et al. |
| 2005/0156227 A1 | 7/2005 | Jeng |
| 2005/0161659 A1 | 7/2005 | Bakkers |
| 2005/0161739 A1 | 7/2005 | Anderson et al. |
| 2005/0162928 A1 | 7/2005 | Rosmeulen |
| 2005/0167766 A1 | 8/2005 | Yagishita |
| 2005/0170593 A1 | 8/2005 | Kang et al. |
| 2005/0184316 A1 | 8/2005 | Kim |
| 2005/0189583 A1 | 9/2005 | Kim et al. |
| 2005/0191795 A1 | 9/2005 | Chidambarrao et al. |
| 2005/0199919 A1 | 9/2005 | Liu |
| 2005/0202604 A1 | 9/2005 | Cheng et al. |
| 2005/0215014 A1 | 9/2005 | Ahn et al. |
| 2005/0215022 A1 | 9/2005 | Adam et al. |
| 2005/0224797 A1 | 10/2005 | Ko et al. |
| 2005/0224798 A1 | 10/2005 | Buss |
| 2005/0227498 A1 | 10/2005 | Furukawa |
| 2005/0230763 A1 | 10/2005 | Huang et al. |
| 2005/0233156 A1 | 10/2005 | Senzaki |
| 2005/0239252 A1 | 10/2005 | Ahn et al. |
| 2005/0255642 A1 | 11/2005 | Liu |
| 2005/0266645 A1 | 12/2005 | Park |
| 2005/0272192 A1 | 12/2005 | Oh et al. |
| 2005/0277294 A1 | 12/2005 | Schaeffer et al. |
| 2005/0280121 A1 | 12/2005 | Doris et al. |
| 2006/0014338 A1 | 1/2006 | Doris et al. |
| 2006/0040054 A1 | 2/2006 | Pearistein et al. |
| 2006/0043380 A1* | 3/2006 | Hiroshi .............. H01L 33/0041 257/79 |
| 2006/0043500 A1 | 3/2006 | Chen et al. |
| 2006/0046521 A1 | 3/2006 | Vaartstra et al. |
| 2006/0063469 A1 | 3/2006 | Talieh et al. |
| 2006/0068590 A1 | 3/2006 | Lindert et al. |
| 2006/0068591 A1 | 3/2006 | Radosavljevic et al. |
| 2006/0071275 A1 | 4/2006 | Brask et al. |
| 2006/0071299 A1 | 4/2006 | Doyle et al. |
| 2006/0086977 A1 | 4/2006 | Shah et al. |
| 2006/0138548 A1 | 6/2006 | Richards et al. |
| 2006/0154478 A1 | 7/2006 | Hsu et al. |
| 2006/0170066 A1 | 8/2006 | Mathew et al. |
| 2006/0172479 A1 | 8/2006 | Furukawa et al. |
| 2006/0172480 A1 | 8/2006 | Wang et al. |
| 2006/0172497 A1 | 8/2006 | Hareland et al. |
| 2006/0180859 A1 | 8/2006 | Radosavljevic et al. |
| 2006/0186484 A1 | 8/2006 | Chau et al. |
| 2006/0202270 A1 | 9/2006 | Son et al. |
| 2006/0204898 A1 | 9/2006 | Gutsche et al. |
| 2006/0205164 A1 | 9/2006 | Ko et al. |
| 2006/0211184 A1 | 9/2006 | Boyd et al. |
| 2006/0220131 A1 | 10/2006 | Kinoshita et al. |
| 2006/0227595 A1 | 10/2006 | Chuang et al. |
| 2006/0240622 A1 | 10/2006 | Lee et al. |
| 2006/0244066 A1 | 11/2006 | Yeo et al. |
| 2006/0263699 A1 | 11/2006 | Abatchev et al. |
| 2006/0281325 A1 | 12/2006 | Chou et al. |
| 2006/0286729 A1 | 12/2006 | Kavalieros et al. |
| 2007/0001219 A1 | 1/2007 | Radosavljevic et al. |
| 2007/0001222 A1 | 1/2007 | Orlowski |
| 2007/0023795 A1 | 2/2007 | Nagano et al. |
| 2007/0029624 A1 | 2/2007 | Nowak |
| 2007/0045735 A1 | 3/2007 | Orlowski et al. |
| 2007/0045748 A1 | 3/2007 | Booth et al. |
| 2007/0048930 A1 | 3/2007 | Figura et al. |
| 2007/0052041 A1 | 3/2007 | Sorada et al. |
| 2007/0093010 A1 | 4/2007 | Mathew et al. |
| 2007/0108514 A1 | 5/2007 | Inoue et al. |
| 2007/0145487 A1 | 6/2007 | Kavalieros et al. |
| 2007/0187682 A1 | 8/2007 | Takeuchi et al. |
| 2007/0241414 A1 | 10/2007 | Narihiro |
| 2007/0262389 A1 | 11/2007 | Chau et al. |
| 2008/0017890 A1 | 1/2008 | Yuan et al. |
| 2008/0017934 A1 | 1/2008 | Kim et al. |
| 2008/0111163 A1 | 5/2008 | Russ et al. |
| 2008/0116515 A1 | 5/2008 | Gossner et al. |
| 2008/0128797 A1 | 6/2008 | Dyer et al. |
| 2008/0212392 A1 | 9/2008 | Bauer |
| 2008/0237655 A1 | 10/2008 | Nakabayashi et al. |
| 2008/0258207 A1 | 10/2008 | Radosavljevic et al. |
| 2009/0061572 A1 | 3/2009 | Hareland et al. |
| 2009/0099181 A1 | 4/2009 | Wurster et al. |
| 2009/0184346 A1* | 7/2009 | Jain .............. B82Y 10/00 257/288 |
| 2010/0200923 A1 | 8/2010 | Chen et al. |
| 2010/0213441 A1* | 8/2010 | Pillarisetty .............. B82Y 10/00 257/24 |
| 2015/0228730 A1* | 8/2015 | Yang .............. H01L 27/092 257/369 |

FOREIGN PATENT DOCUMENTS

| | | |
|---|---|---|
| JP | 56073454 A | 6/1981 |
| JP | 02-14578 | 1/1990 |
| JP | 0600 5856 | 1/1994 |
| JP | 06-061260 | 3/1994 |
| JP | 06-151387 A | 5/1994 |
| JP | 7-50421 A | 2/1995 |
| JP | 09-074205 | 3/1997 |
| JP | 10004198 A | 1/1998 |
| JP | 11-121622 | 4/1999 |
| JP | 2001085692 A | 3/2001 |
| JP | 2001-189453 | 7/2001 |
| JP | 2001298194 A | 10/2001 |
| JP | 2001 338987 | 12/2001 |
| JP | 2002-009289 A | 1/2002 |
| JP | 2002110963 A | 4/2002 |
| JP | 2002198538 | 7/2002 |
| JP | 2002-298051 | 10/2002 |
| JP | 2002-110977 A | 12/2002 |
| JP | 2003-229575 | 8/2003 |
| JP | 2004-221334 A | 8/2004 |
| JP | 2005-173606 | 12/2006 |
| KR | 10 0222363 | 10/1999 |
| TW | 2004 14538 | 8/1992 |
| TW | 2005 18310 | 11/1998 |
| TW | 508669 | 11/2002 |
| TW | 546713 | 8/2003 |
| TW | 591798 | 6/2004 |
| TW | 594990 | 6/2004 |

(56) References Cited

FOREIGN PATENT DOCUMENTS

| TW | 2004 14539 | 8/2004 |
| --- | --- | --- |
| TW | 2004 17034 | 9/2004 |
| TW | I223449 | 11/2004 |
| TW | I231994 | 5/2005 |
| TW | I238524 | 8/2005 |
| TW | I239102 | 9/2005 |
| WO | WO 01/18877 A1 | 3/2001 |
| WO | WO 02/095814 | 11/2002 |
| WO | WO 03/001604 A2 | 1/2003 |
| WO | WO 03/003442 | 1/2003 |
| WO | WO 2005/034212 A2 | 4/2005 |
| WO | WO 2005/036651 A1 | 4/2005 |
| WO | WO 2005/098963 A1 | 10/2005 |
| WO | WO 2006/007350 A1 | 1/2006 |
| WO | WO 2006/078469 A1 | 7/2006 |
| WO | WO 2007/002426 A2 | 1/2007 |
| WO | WO 2007/041152 A1 | 4/2007 |

OTHER PUBLICATIONS

Buchanan, D. A., et al., "Fabrication of Midgap Metal Gates Compatible with Ultrathin Dielectrics," Applied Physics Letters, 73.12, (Sep. 21, 1996), pp. 1676-1678.

Clafin, B., et al., "Interface Studies of Tungsten Nitride and Titanium Nitride Composite Metal Gate Electrodes with Thin Dielectric Layers," Journal of Vacuum Science and Technology A 16.3, (May/Jun. 1998), pp. 1757-1761.

Collaert, N. et al. "A Functional 41-Stage ring oscillator using scaled FinFET devices with 25-nm gate lengths and 10-nm fin widths applicable for the 45-nm CMOS node" IEEE Electron Devices Letters, vol. 254, No. 8 (Aug. 2004), pp. 568-570.

Hwang, Jeong-Mo et al., "Novel Polysilicon/Tin Stacked-Gate Structure for Fully-Depleted SOI/CMOS," International Electronic Devices Meeting Technical Digest, (1992), pp. 345-348.

Nackaerts et al., "A 0.314µm² 6T-SRAM Cell build with Tall Triple-Gate Devices for 45nm node applications using 0.75NA 193nm lithography," IDEM, (Dec. 13, 2004), pp. 269-272.

Nowak, Edward J. et al., "Turning Silicon On Its Edge . . . ," IEEE Circuits & Devices Magazine, vol. 1, (Jan./Feb. 2004), pp. 20-31.

Park, Donggun et al., "3-Dimensional nano-SMOS Transistors to Overcome Scaling Limits," IEEE 2004, ISBN 0-7803-8511-X, (Oct. 18, 2004), pp. 35-40.

Park, Jong-Tae, et al., "Pi-Gate SOI MOSFET". IEEE Electron Devices Letters, vol. 22, No. 8, Aug. 2001, pp. 405-406.

Sugizaki, T. et al., "Novel Multi-bit SONOS Tpye Flash Memory Using a High-k Charge Trapping Layer," VLSI Technology, 2003, Digest of Technical Papers, Symposium on, Jun. 10-12, 2003, (2003), pp. 27-28.

Tang, Stephen H. et al., "FinFET—A quasi-planar double MOSFET", 2001 IEEE International Solid-State Circuits Conference (Feb. 6, 2001), pp. 1-3.

Tokoro, Kenji et al., "Anisotropic Etching Properties of Silicon in KOH and TMAH Solutions," International Symposium on Micromechatronics and Human Science, IEEE (1998), pp. 65-70.

Wolf, Stanley et al., "Wet Etching Silicon," Silicon Processing for the VLSI Era, vol. 1: Process Technology, Lattice Press, Sunset Beach, CA, (Sep. 1986), (3 pgs.).

Wang, X., et al., "Band alignments in sidewall strained Si-strained SiGe heterostructures", (May 28, 2002), 1-5.

Yang, Fu-Liang et al., "25nm CMOS Omega FETs" IEEE 2002, 10.3.1-10-.3.4, pp. 255-258.

Doyle, B. et al.: Tri-Gate Fully Depleted CMOS Transistors: Fabrication, Design and Layout. In: Symposium on VLSI Technology Digest of Technical Papers 2003, 2003, 133.

Doyle, B.S. et al.: High Performance Fully-Depleted Tri-Gate CMOS Transistors. In: IEEE Electron Device Letters, 24, 2003, 4, 263.

Colinge, J.P. et al.: Threshold Voltage and Subthreshold Slope of Multiple-Gate SOI MOSFETs. In: IEEE Electron Device Letters, 24, 2003, 8, 515.

Fossum, J.G. et al.: Suppression of Corner Effects in Triple-Gate MOSFETs. In: IEEE Ekectron Device Letters, 24, 2003, 12, 745.

Colinge, J.P., et al., "SOI Devices for Sub-0.1 µm Gate Lengths", Processings 23$^{rd}$ International Conference on Microelectronics, May 12-15, 2002 pp. 109-113, vol. 1 Niš, Yugoslavia.

\* cited by examiner

FIELD EFFECT TRANSISTOR WITH NARROW BANDGAP SOURCE AND DRAIN REGIONS AND METHOD OF FABRICATION

CLAIM OF PRIORITY

This application is a continuation of U.S. patent application Ser. No. 15/179,884, filed Jun. 10, 2016, which is a continuation of U.S. patent application Ser. No. 14/702,608, filed May 1, 2015, now issued as U.S. Pat. No. 9,368,583, which is a continuation of U.S. patent application Ser. No. 14/465,636, filed Aug. 21, 2014, now U.S. Pat. No. 9,043,314, which is a continuation of U.S. patent application Ser. No. 14/137,304, filed Dec. 20, 2013, now U.S. Pat. No. 8,816,394, which is a continuation of U.S. patent application Ser. No. 13/752,272, filed Jan. 28, 2013, now U.S. Pat. No. 8,664,694, which is a continuation of U.S. patent application Ser. No. 13/453,403 filed on Apr. 23, 2012, now U.S. Pat. No. 8,368,135, which is a continuation of U.S. patent application Ser. No. 13/021,640 filed on Feb. 4, 2011, now issued as U.S. Pat. No. 8,183,646, which is a divisional of U.S. patent application Ser. No. 12/850,582 filed on Aug. 4, 2010, now issued as U.S. Pat. No. 7,893,506, which is a continuation of U.S. patent application Ser. No. 12/343,400 filed on Dec. 23, 2008, now issued as U.S. Pat. No. 7,825,481, which is a divisional of U.S. patent application Ser. No. 11/064,996 filed on Feb. 23, 2005, now issued as U.S. Pat. No. 7,518,196.

BACKGROUND OF THE INVENTION

1. Field of the Invention

The present invention relates to the field of field effect transistors and more particularly to a field effect transistor having a pair of source/drain regions formed from a narrow bandgap semiconductor film and its method of fabrication.

2. Discussion of Related Art

Integrated circuits, such as microprocessors, digital signal processors, and memory devices are made up of literally millions of transistors coupled together into functional circuits. An example of a conventional metal oxide semiconductor field effect transistor (MOSFET) 100 is illustrated in FIG. 1. Transistor 100 includes a gate electrode 102 formed on a gate dielectric layer 104 which in turn is formed on a monocrystalline silicon substrate. A pair of sidewall spacers 108 are then formed along laterally opposite sidewalls of the gate electrode 102. A pair of source/drain regions 110 are then formed along opposite sides of the gate electrode 102 as shown in FIG. 1. The source and drain regions comprise heavily doped portions of the silicon substrate 106. Typically, a silicide layer 112, such as titanium silicide or nickel silicide, is used to couple contacts 120 formed in a interlayer dielectric 140 to the source and drain regions 110. Silicide regions 112 are generally formed by alloying a metal, such as titanium, nickel or cobalt with the silicon substrate 106 to form the metal silicide. Additionally, contacts 120 are generally formed from a relatively high resistance film such as tungsten which can be conformally deposited so that it fills contact opening formed in the into dielectric layer 140.

The dimension of transistor 100 are continually being scaled down in order to increase packing density and thereby increase the computational power of the fabricated integrated circuits. Unfortunately, as transistor 100 is continually scaled down, the external resistance of the device (Rext) is increased degrading device performance, such as its drive current. Presently, the problem of increased Rext is solved by high active doping of the source and drain region and fully siliciding the source and drain regions. High active doping of the source and drain regions can decrease the electron mobility in the source and drain regions. Fully siliciding the source and drain regions results in a schkotty barrier transistors resulting in ambipolar conduction. Additionally, formation of silicide films by alloying a metal and the semiconductor substrate together can increase the thermal budget of the device which can decrease device performance.

DETAILED DESCRIPTION OF THE PRESENT INVENTION

The present invention is a field effect transistor having a pair of source/drain regions formed from a narrow bandgap semiconductor film. In the following description numerous specific details are set forth in order to provide a thorough understanding of the present invention. In other instances, well known semiconductor processing techniques and equipment have not been forth in particular detail in order to not unnecessarily obscure the present invention.

Embodiments of the present invention include a field effect transistor having a pair of source/drain regions formed from a narrow energy bandgap (e.g., less than 0.75 eV) semiconductor film. In an embodiment of the present invention, the silicon substrate adjacent to the gate electrode is etched out and refilled with a selective epitaxial regrowth of a narrow bandgap high mobility compound semiconductor material. By forming the source and drain regions from a narrow bandgap high conductivity semiconductor, such as indium antimonide (InSb), indium arsenide (InAs), indium gallium arsenide ($In_{1-x}Ga_xAs(x>50\%)$) and indium phosphide (InP), a significant reduction in the parasitic series resistance in extremely scaled sub-50 nanometer MOSFETs can be obtained. Additionally, in embodiments of the present invention, non-alloyed ohmic contacts are used to make contact to the narrow bandgap semiconductor film which results in a very low thermal budget in the front end process thereby improving device performance. Additionally, in embodiments of the present invention, the transistor is formed in a thin silicon layer of silicon-on-insulator (SOI) substrate in order to decrease or remove the possibility of increased junction leakage current. Source and drain regions formed from a narrow bandgap semiconductor material can be used to decrease the parasitic resistance in both planar and nonplanar devices.

Figure 1:
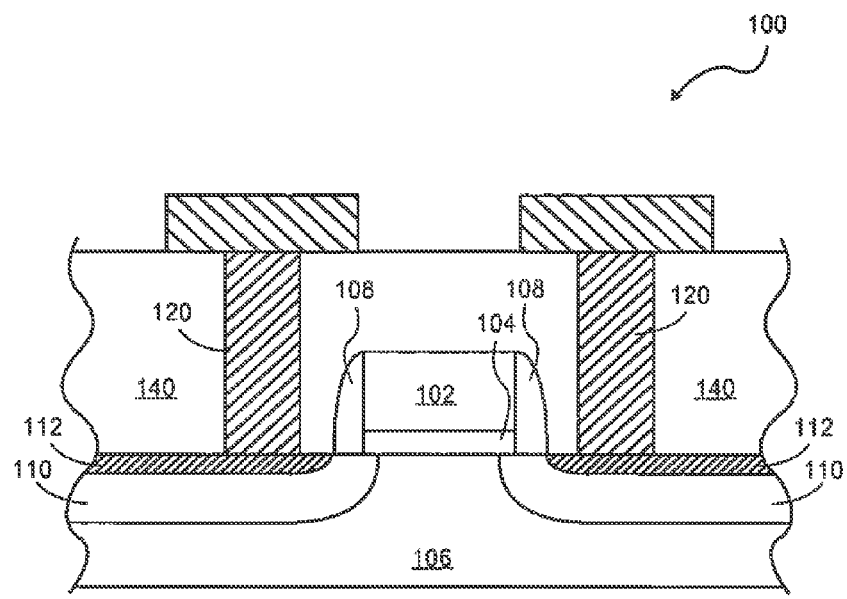
FIG. 1 is an illustration of a cross-sectional view of a standard MOS nonplanar field effect transistor.
Figure 2A:
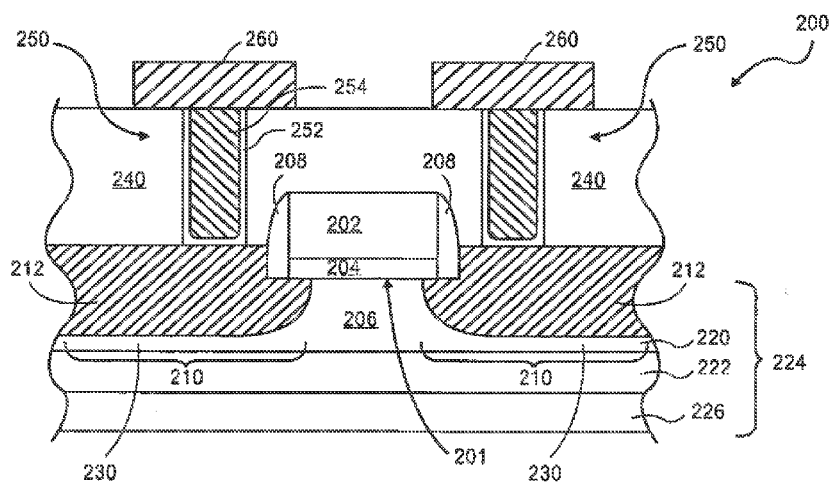
FIGS. 2A and 2B are illustrations of cross-sectional views of nonplanar field effect transistors having a pair of source/drain regions formed from a narrow bandgap semiconductor in accordance with embodiments of the present invention.

FIG. 2A is an example of a metal oxide semiconductor field effect transistor (MOSFET) 200 in accordance with an embodiment of the present invention. Transistor 200 has a gate electrode 202 formed on a gate dielectric layer 204 formed on a silicon layer 206. A pair of sidewall spacers 208 are formed along laterally opposite sidewalls of gate electrode 202 as shown in FIG. 2A. Transistor 200 has a pair of source/drain regions 210 formed on opposite sides of gate electrode 202. A channel region 206 is located in the silicon layer between the source and drain regions 210.

Figure 4:
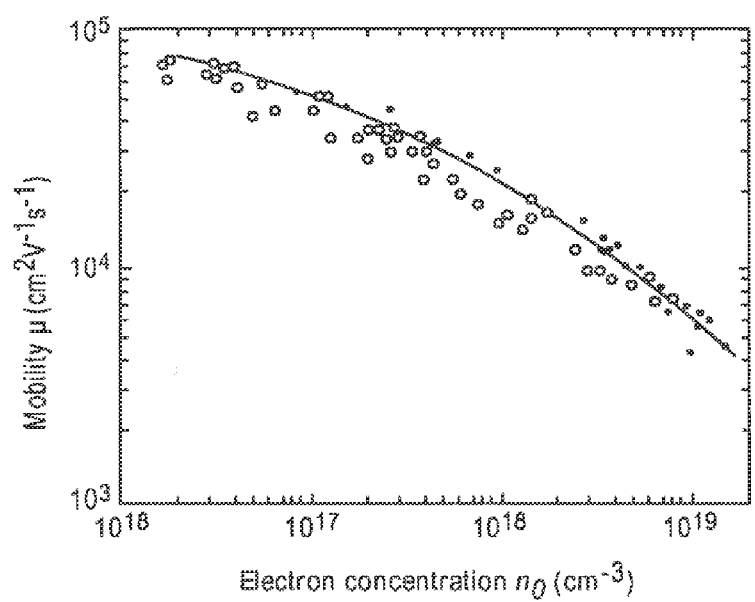
FIG. 4 is a plot showing the electron mobility verses sheet carrier concentration for indium antimonide (InSb).

In an embodiment of the present invention, the source and drain regions 210, or a portion of the source and drain regions 210, are formed from a low or narrow bandgap energy semiconductor film 212. In an embodiment of the present invention the narrow bandgap semiconductor is an epitaxial or single crystalline film. In an embodiment of the present invention, the source and drain regions 210 are formed from a narrow bandgap semiconductor 212 having an energy bandgap of less than 0.75 eV and in embodiments less than 0.36 eV. In an embodiment of the present invention, the narrow bandgap semiconductor film 212 is a compound semiconductor film having a bandgap between 0.75 eV and 0.18 eV. In an embodiment of the present invention, the source and drain regions 210 include a epitaxial narrow bandgap, high mobility compound semiconductor material 212, such as but not limited to indium antimonide (InSb), indium arsenide (InAs), indium gallium arsenide ($In_{1-x}Ga_xAs(x>50\%)$) and indium phosphide (InP). In an embodiment of the present invention, the source and drain region 210 are formed from a compound semiconductor 212 having bulk mobility between 10,000-80,000 $\mu(cm^2V^{-1}s^{-1})$. An advantage of using a narrow bandgap semiconductor in the source and drain regions, is that they have low sheet resistivities due to their inherently high mobilities and superior electron transport properties as compared to silicon. FIG. 4 is a plot which illustrates the electron mobility in InSb vs. the carrier concentration. The higher mobility results in a low sheet resistance ($R_{sd}$). Another advantage of using a narrow bandgap semiconductor 212 with very high mobility is that it provides a lower band offset, $Ø_b$, and a lower effective electron mass (m*) which results in a lowering of the contact resistivity, $\rho c$, which results in a lower contact resistance, $R_c$, compared to conventional n+ implanted silicon source and drain regions with nickel silicide contacts.

In an embodiment of the present invention, transistor 200 has raised source and drain regions. Raised source and drain regions are formed by having the narrow bandgap semiconductor film 212 extend above the top surface 201 of the silicon film upon which the gate dielectric layer 204 is formed. In an embodiment of the present invention, the narrow bandgap semiconductor film 212 of the source and drain regions 210 extends at least 200Å above the silicon surface 201 and generally between 200-300Å above the surface 201. The dielectric sidewall spacers 208 isolate the raised portion of the source and drain regions 210 from the gate electrode 202. As such, the spacers 208 are formed to a width sufficient enough to isolate the narrow bandgap semiconductor films from the gate electrode 202 as well as wide enough to reduce the parasitic Miller capacitance which can develop between the raised source and drain regions and the gate electrode 202. Additionally, spacers 208 should not be formed too wide so that current traversal path is increased and packing density decreased. In an embodiment of the present invention, the sidewall spacers are formed from an insulating film, such as silicon nitride or silicon oxide, having a width of between 100-500Å.

In an embodiment of the present invention, as illustrated in FIG. 2A, the narrow bandgap semiconductor 212 laterally extends completely beneath spacer 208 and slightly extends beneath or undercuts the gate dielectric/gate electrode 204/202. In an embodiment of the present invention, the narrow bandgap semiconductor 212 extends beneath the outside edges of the gate electrode 210 by approximately 50-70 Å.

Additionally, when forming an n type field effect transistor (FET) where the majority carriers are electrons, the narrow bandgap semiconductor is doped to an n type conductivity and when forming a p type field effect transistor where the majority carriers are holes, the narrow bandgap semiconductor 212 is doped to a p type conductivity. A narrow bandgap semiconductor 212, such as indium antimonide (InSb), indium arsenide (InAs), indium gallium arsenide ($In_{1-x}Ga_xAs(x>50\%)$) and indium phosphide (InP), can be doped to an n type conductivity with, for example, tellurium (Te), silicon (Si) and sulfur (S) and doped to a p type conductivity with, for example, carbon (C), cadmium (Cd), zinc (Zn) and chromium (Cr).

Figure 2B:
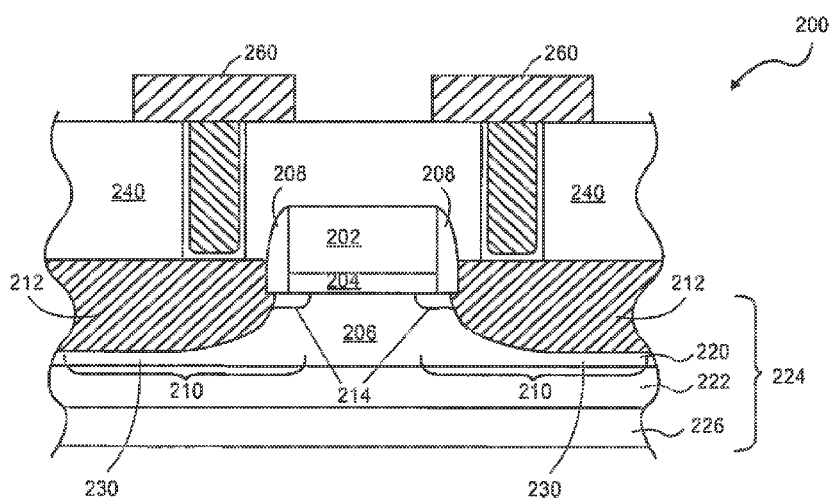

In an embodiment of the present invention, the source and drain regions can include a pair of source/drain extensions or tip regions 214 as illustrated in FIG. 2B. Source/drain extensions are a portion of the source/drain regions 210 and are formed by doping the silicon layer and extend beneath the gate electrode and spacers. The extensions 214 are doped to a p type conductivity for a p type device and to an n type conductivity for a n type device. If the source/drain extensions 214 are provided, then the narrow bandgap semiconductor portion 212 of the source and drain regions 210, need not extend beneath the outside edges of the gate electrode because the laterally tip regions 214 extend the source and drain regions 210 beneath the spacers 208 and gate electrode 202 as shown in FIG. 2B. In an embodiment of the present invention, the narrow bandgap semiconductor 212 extends only slightly beneath the sidewall spacers 208 where it contacts the source/drain extensions 214. In yet another embodiment of the present invention, the narrow bandgap semiconductor 212 contacts the source/drain extensions 214 in alignment with the outside edges of the sidewall spacers 208.

In an embodiment of the present invention, transistor 200 is formed in a silicon layer which is part of a monocrystalline silicon substrate. When transistor 200 is formed in a monocrystalline silicon substrate, the channel region 206 is formed in a doped region of the monocrystalline silicon substrate and the narrow bandgap semiconductor film 210 is formed in recesses formed in the monocrystalline silicon substrate. When a transistor is formed in a monocrystalline silicon substrate, the transistor is sometimes referred to as "a bulk" transistor. Unfortunately, forming the source and drain regions 210 from a low bandgap semiconductor, a bulk device can cause an increase the junction leakage current. Accordingly, in an embodiment of the present invention, in order to reduce the junction leakage current, transistor 200 is formed in a thin epitaxial silicon film 220 of a silicon-on-insulator (SOI) substrate 224. A silicon-on-insulator (SOI) substrate 224 includes a thin silicon film 220 formed on a buried oxide layer 222 which in turn is formed on a monocrystalline silicon substrate 226. In an embodiment of the present invention, the narrow bandgap semiconductor portions 212 of the source and drain regions 210 are formed in recesses formed in the epitaxial silicon film 220 of the SOI substrate 226. In an embodiment of the present invention, a small portion 230 of the epitaxial silicon film 220 remains between the buried oxide layer and the bottom of the narrow bandgap semiconductor 212 so that an epitaxial narrow bandgap semiconductor film can be selectively grown on the epitaxial silicon film 220. In an embodiment of the present invention, the portion 230 of the epitaxial silicon film remaining between the buried oxide layer and the narrow bandgap semiconductor film 212 is between 10-100Å thick.

Additionally, in an embodiment of the present invention, an interlayer dielectric 240, such as but not limited to a silicon dioxide film or a low k dielectric, such as a fluorine doped silicon dioxide (SiOF), a carbon doped oxide (CDO) or a zeolite dielectric, is formed over and around transistor 200 as shown in FIGS. 2A and 2B. The interlayer dielectric layer 240 isolates transistor 200 from the upper levels of metallization 260 used to interconnect the various transistor 200 formed on substrate 224 into function circuits, such as microprocessors, digital signal processors and memory devices. Metal contacts 250 are formed through the interlayer dielectric and directly contact the narrow bandgap semiconductor material 212 of the source and drain regions 210 to provide electrical connection between the first level of metallization and the source and drain regions 210 as illustrated in FIG. 2A. In an embodiment of the present invention, the metal contacts 250 form a low resistance non-alloyed ohmic contact with a narrow bandgap semiconductor 210. In an embodiment of the present invention, metal contacts 250 comprise a lower titanium adhesion layer 252 and a bulk gold (Au) layer 254. In an embodiment of the present invention, there is no silicide or alloyed films formed between the narrow bandgap semiconductor film 210 and the contact 250. The use of a non-alloyed metal contact 250 results in a very low thermal budget in the front end of the process flow and its associated benefits.

Figure 5:
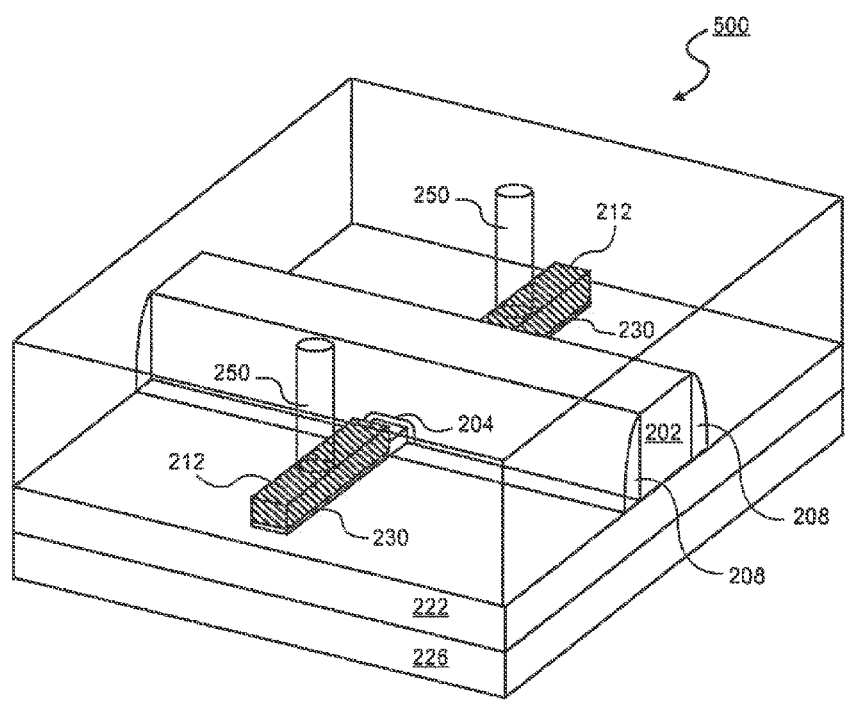
FIG. 5 is an illustration of a nonplanar transistor having a pair of source/drains formed from a narrow bandgap semiconductor.

It is to be appreciated that the present invention is not limited to planar devices and can be used in nonplanar devices, such as tri-gate transistors and dual gate transistors. FIG. 5 illustrates a tri-gate transistor 500 having source and drain regions comprising a narrow bandgap semiconductor film 212. In a nonplanar device, instead of forming the gate dielectric layer 204 on a single surface of a silicon film, the silicon film is first patterned into a silicon body having a top surface opposite a bottom surface formed on buried oxide and a pair of laterally sidewalls as shown in FIG. 5. The gate dielectric layer 204 is then formed on the top surface and sidewalls of the silicon body as shown in FIG. 5. A gate electrode is then formed on the gate dielectric layer on the top surface of a silicon body and directly adjacent to the gate dielectric layer 204 on the sidewalls of the semiconductor body so that the gate electrode 202 surrounds the channel region of the silicon body on three sides. In a FINFET or dual gate device, the gate electrode 202 can be isolated from the silicon body by a thick dielectric layer (not shown) so that the gate only controls two sides of the body. The portion of the silicon body on opposite sides of the gate electrode used to form the source and drain regions can then be partially etched away so that the narrow bandgap semiconductor film 212 can be regrown to form the source and drain regions 210.

Figure 3A:
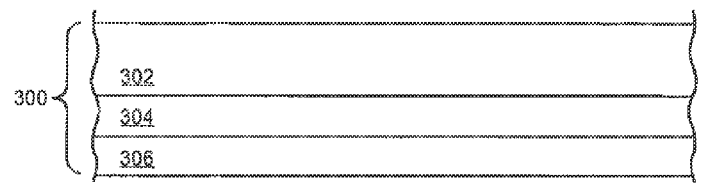
FIGS. 3A-3F illustrate a method of fabricating a field effect transistor having a pair of source/drain regions comprising a narrow bandgap semiconductor in accordance with embodiments of the present invention.

FIGS. 3A-3F illustrate a method of forming a field effect transistor having source and drain regions formed from a narrow bandgap semiconductor film in accordance with embodiments of the present invention. The fabrication of a transistor in accordance with the present invention begins with a substrate. In an embodiment of the present invention, the substrate is a monocrystalline silicon substrate, for example, when forming a bulk semiconductor device. In an embodiment of the present invention, the monocrystalline silicon substrate may include an epitaxial silicon film formed on the monocrystalline substrate as is well known in the art. In yet another embodiment of the present invention, the substrate is a silicon-on-insulator (SOI), such as substrate 300 as illustrated in FIG. 3A. In an embodiment of the present invention, the silicon-on-insulator substrate 300 includes an epitaxial silicon film 302 formed on a buried oxide layer 304 which in turn is formed on a monocrystalline silicon substrate 306. In an embodiment of the present invention, the buried oxide layer has a thickness between 200-2000Å. Additionally, in an embodiment of the present invention, the epitaxial silicon film or layer 302 has a thickness of between 10-400Å.

Isolation regions, not shown, are typically formed in the silicon film 302 or substrate adjacent to the device fabrication area to isolate the fabricated transistor from adjacent transistors. The epitaxial silicon film 302 is then doped to a conductivity type and concentration desired for the channel region of the device. In an embodiment of the present invention, when fabricating a p type transistor, the silicon film can be doped to an n type conductivity and when fabricating an n type device the silicon film 302 can be doped to a p type conductivity. Typically, the semiconductor film 302 will be doped to an n type or p type conductivity with a concentration level between $1\times10^{16}$-$1\times10^{19}$ atoms/cm$^3$. In an embodiment of the present invention, the silicon film 302 is left undoped or intrinsic in order to fabricate a transistor with an undoped or intrinsic channel region.

Figure 3B:
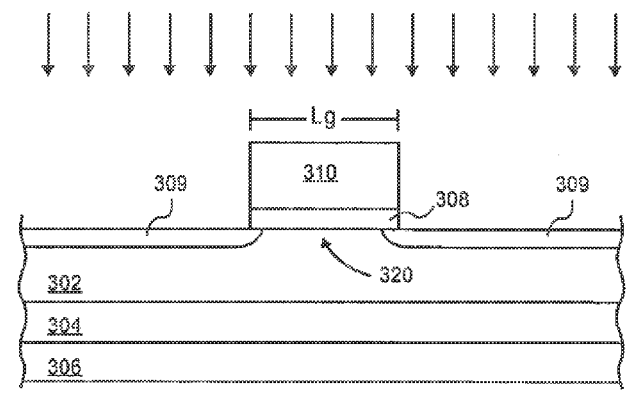

Next, as shown in FIG. 3B, a gate dielectric layer 308 is formed on the epitaxial silicon film 302 and a gate electrode 310 formed on the gate dielectric layer 308. The gate dielectric layer can be a deposited or grown dielectric. In an embodiment of the present invention, the gate dielectric layer is a silicon dioxide or a silicon oxynitride dielectric film grown with a wet/dry oxidation process. In an embodiment of the present invention, the silicon oxide film is grown to a thickness between 5-15Å. In an embodiment of the present invention, the gate dielectric layer is a deposited dielectric, such as but not limited to a high dielectric constant film (high k), such as a metal oxide dielectric, such as tantalum pentaoxide, titanium oxide, hafnium oxide, zirconium oxide, aluminum oxide, and various silicates or other high k dielectric, such lead zirconium titanate (PZT) and barium strontium titanate (BST). A high dielectric constant film can be formed by any well known technique, such as but not limited to chemical vapor deposition (CVD) and atomic layer deposition (ALD).

The gate electrode 310 can be formed by any well known technique, such as by blanket depositing a gate electrode material over substrate 300 and then utilizing well known photolithography and etching techniques to pattern the gate electrode material into a gate electrode 310. In an embodiment of the present invention, the gate electrode 310 has a pair of laterally opposite sidewalls separated by a distance which defines the gate length (Lg) of the transistor. In an embodiment of the present invention, gate electrode 310 has a gate length (Lg) of less than 50 nanometers. The gate electrode 310 may be formed from any suitable gate electrode material. In an embodiment of the present invention, the gate electrode material may comprise a polycrystalline silicon. In an embodiment of the present invention, the electrode material comprises a polycrystalline silicon germanium alloy. In yet another embodiment of the present invention, the gate electrode material may comprise a metal film, such as tungsten, tantalum and their nitrides. In an embodiment of the present invention, the gate electrode has a thickness or height between 200-3000Å.

It is to be appreciated that when forming a nonplanar transistor, such as a tri-gate or dual gate transistor, epitaxial silicon film 302 would first be patterned into a silicon body having a top surface opposite the buried oxide layer 304 and a pair of laterally opposite sidewalls as is well known in the art. When forming a tri-gate device, the gate dielectric layer would be formed on the top surface and sidewalls of the fabricated semiconductor body and then the gate electrode formed on and adjacent to the gate dielectric layers so that the gate electrode surrounds the semiconductor body on three sides as is well known in the art. When forming a dual gate or FINFET device, a thick insulating layer may be left on the top surface of a semiconductor body to isolate the gate electrode from the top surface of a semiconductor body so that the gate electrode controls only the two sidewalls of the body as is well known in the art.

Next, after the formation of gate dielectric layer 308 and gate electrode 310, source/drain extensions 309 may be formed in semiconductor film 302 on opposite sides of gate electrode 310 as shown in FIG. 3B, if desired. Source/drain extensions 309 can be formed by, for example, ion implanting dopants into the silicon layer 302. The gate electrode 310 can act as a mask to prevent the doping of a channel region 320 during the ion implantation process resulting in the formation of source/drain extensions 309 which are formed in alignment with the outside edges of gate electrode 310. A subsequent anneal can be used to cause the dopants to slightly diffusion beneath the outside edges of the gate electrode 310 as shown in FIG. 3B. Then gate electrode 310 is a polysilicon gate electrode the source/drain extension implant process can be used to dope the polysilicon film to reduce its resistance. The source/drain extensions 309 can be used, for example, when the narrow bandgap semiconductor film for the source and drain regions is not extended beneath the gate electrode. When fabricating a transistor where the narrow bandgap semiconductor laterally extends beneath the gate electrode 310, the source/drain extension formation process may not be necessary. Omitting the source/drain extension process can help reduce the thermal budget of the front-end process and thereby improve device performance.

Figure 3C:
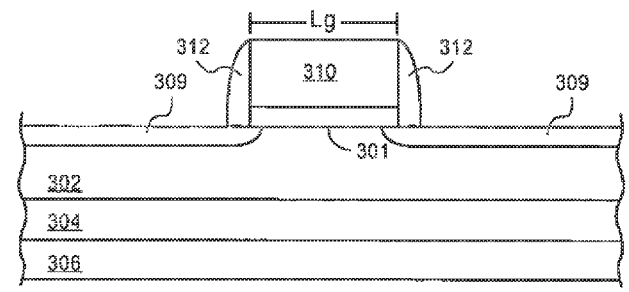

Next, as shown in FIG. 3C, a pair of thin sidewall spacers 312 are formed adjacent to the laterally opposite sidewalls of gate electrode 310. Sidewall spacers 312 can be formed by blanket depositing a conformal insulating film, such as silicon nitride, silicon oxynitride, or silicon oxide or a combination thereof over substrate 300 and gate electrode 310 and then anisotropically etching back the dielectric film to form spacers 312. The thickness of the deposited dielectric film determines the thickness of the spacers 312. In an embodiment of the present invention, the spacers 312 are formed to a thickness between 100-500Å. In an embodiment of the present invention, the spacers 312 are formed from a silicon nitride film formed by a hot wall low pressure chemical vapor deposition process (LPCVD).

Figure 3D:
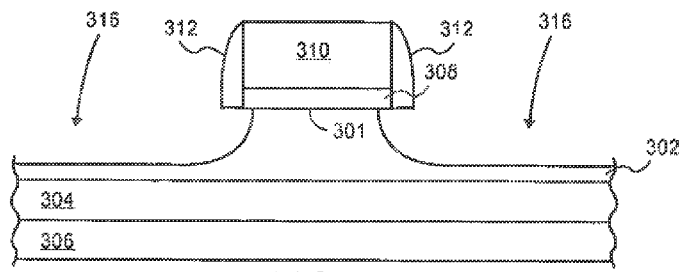

Next, a pair of recesses 316 are formed in silicon film 302 on opposite sides of gate electrode 308 as shown in FIG. 3D. In an embodiment of the present invention, recesses 316 extend beneath the outside edge of gate electrode 310 and gate dielectric layer 308 as shown in FIG. 3D. In an embodiment of the present invention, recesses 316 extend between approximately 50-70Å beneath the outside edges of the gate electrode 310. In an embodiment of the present invention, the recesses are formed to a depth of approximately 5-350Å beneath the surface 301 of silicon film 302 upon which the gate dielectric layer 308 is formed. In an embodiment of the present invention, a portion of the silicon film 302 remains in recess 316 above buried oxide layer 304 so that narrow bandgap semiconductor film can be subsequently selectively epitaxially grown thereon. Any well known and suitable etching technique can be utilized to form recesses 316. In an embodiment of the present invention, a selective etch process is used to form recesses 316. In a selective etch process, an etchant is used which only etches silicon films, such as epitaxial silicon layer 302 and not insulating films such as spacers 310, gate dielectric 308 and isolations regions. (If gate electrode 310 is formed from polycrystalline silicon, an insulating hard mask can be used to form gate electrode 310 then left on during the etching of recesses 316 to protect the silicon electrode from being etched). In an embodiment of the present invention, an isotropic etching processes, such as a wet etch, is used to form recesses 316 so that the recess 316 can laterally undercut spacers 312 and gate electrode 310. In an embodiment of the present invention, recesses 316 are formed with a wet etch comprising an ammonium hydroxide or asymmetric or symmetric tetra (alkyl) ammonium hydroxides (alkyl=methyl, ethyl, propyl, isopropyl, butyl, tert-butyl; symmetric meaning all 4 alkyl groups are the same).

Figure 3E:
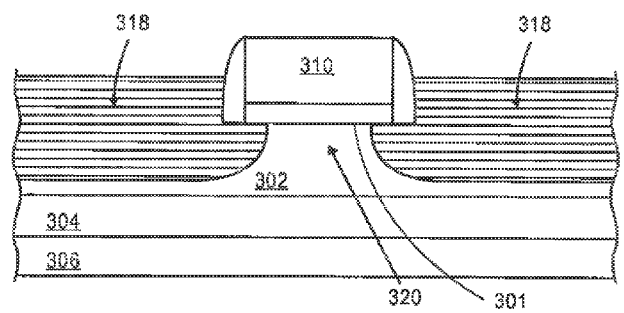

Next, as shown in FIG. 3E, recesses 316 are filled with a narrow bandgap semiconductor film, such as but not limited to indium antimonide (InSb), indium arsenide (InAs), indium gallium arsenide ($In_{1-x}Ga_xAs(x>50\%)$) and indium phosphide (InP). In an embodiment of the present invention, the narrow bandgap semiconductor 318 is deposited to a thickness to fill recess 318 and in another embodiment of the present invention, is deposited to a thickness sufficient to extend above the top surface 301 of silicon film 302 in order to form raised or elevated source and drain regions. In an embodiment of the present invention, the narrow bandgap semiconductor film extends at least 200Å above top surface 301 of silicon film 302 and in an embodiment of the present invention, extends between 200-500Å.

Any well known and suitable technique can be used to deposit narrow bandgap semiconductor film 318. In an embodiment of the present invention, the narrow bandgap semiconductor film 318 is grown with an epitaxial process, such as but not limited to, molecular beam epitaxy (MBE), metal organic chemical vapor deposition (MOCVD), and low pressure chemical vapor deposition (LPCVD).

In embodiment of the present invention, the narrow bandgap semiconductor film 318 is in situ doped (i.e., doped while it is deposited) to an n type or p type conductivity. Semiconductor film 318 can be doped to an n type conductivity utilizing dopant atoms, such as silicon (Si) or tellurium (Te) and can be doped to a p type conductivity atoms utilizing, for example, carbon (C), cadmium (Cd), zinc (Zn) and chromium (Cr). In an embodiment of the present invention, the narrow bandgap semiconductor film has a melting temperature between 550-500° C. so that it can be deposited at a relatively low temperature, such as less than 500° C., and still enable dopant atoms to substitute into the narrow bandgap semiconductor lattice without requiring an activation anneal. Eliminating an activation anneal reduces the thermal budget of the process used to fabricate the transistor.

In an alternative embodiment of the present invention, the narrow bandgap semiconductor film 318 can be deposited undoped and then subsequently doped by, for example, ion implantation or solid source diffusion.

In an embodiment of the present invention, the narrow bandgap semiconductor film 318 is selectively grown into recesses 316. In a selective deposition process, the narrow bandgap semiconductor forms only on silicon locations, such as epitaxial silicon film in recesses 316 and not on insulating or dielectric layers, such as sidewall spacers 312 and isolation regions. If gate electrode 310 is formed from a polycrystalline silicon or silicon germanium alloy, then an insulating hard mask can be used during the patterning of the gate electrode and left on during the growth of the narrow bandgap semiconductor 318 in order to prevent the formation of a narrow bandgap semiconductor film on the gate electrode. The epitaxial silicon film 302 in the lower parts of recesses 316 provide a single crystalline lattice from which an epitaxial narrow bandgap semiconductor film can be grown.

In an embodiment of the present invention, an InSb epitaxial silicon film 318 is grown in recess 316 utilizing a MOCVD process utilizing an equimolar gaseous mixture of volatized trimethylindium and stibane ($SbH_3$) with about 5% each by mass in a carrier gas such as argon. In an embodiment of the present invention, an indium antimonide (InSb) epitaxial film is grown utilizing molecular beam epitaxial (MBE) utilizing a solid source.

In embodiment of the present invention, non-alloyed ohmic contacts 340 are used to electrically couple the source and drain region to the upper levels of metallization 350. Accordingly, first an interlayer dielectric (ILD) 330, such as but not limited to silicon dioxide ($SiO_2$), fluorine doped silicon dioxide (SiOF) and carbon doped oxide (CDO), is blanket deposited over substrate 300 including gate electrode 310, spacers 312 and narrow bandgap semiconductor 318. The interlayer dielectric 330 is formed to a thickness sufficient to isolate the gate electrode 310 and narrow bandgap semiconductor 318 from the subsequently formed upper level of metallization 350. In an embodiment of the present invention, the interlayer dielectric is formed to a thickness between 500Å-2000Å. It is to be appreciated that an interlayer dielectric need not necessarily be a single layer dielectric and can be a composite dielectric layer formed from multiple insulating layers. After depositing the interlayer dielectric, the interlayer dielectric may be planarized to provide a planar top surface.

Figure 3F:
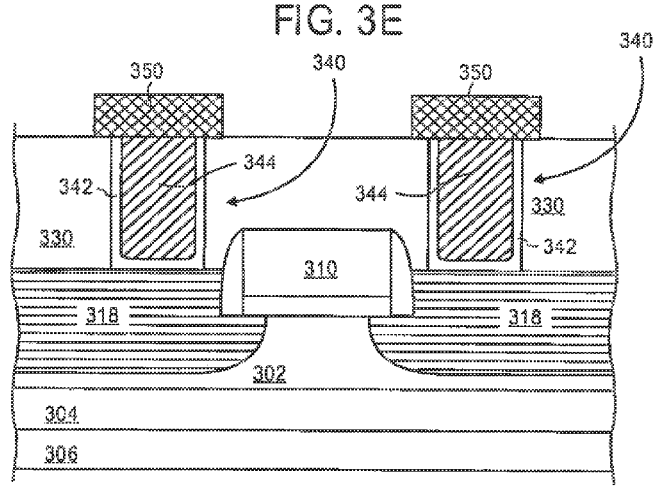

Next, contact openings can then be formed through interlayer dielectric 330 utilizing well known photolithography and etching techniques at locations where contacts 340 are desired to contact the narrow bandgap semiconductor 318. Conductive contacts 340 are then formed into the openings and make direct contact with the narrow bandgap semiconductor film 318. In an embodiment of the present invention, contacts 340 are formed by blanket depositing a conductive contact film by, for example, chemical vapor deposition (CVD) or atomic layer deposition (ALD) into the openings and onto the top surface of ILD 330. The conductive film is then removed from the top surface of the ILD by, for example, plasma etch back or chemical mechanical planarization, to form contacts 340. In an embodiment of the present invention, the contacts are formed from a high conductivity metal or metals having a low work function, such as a work function less than 4 eV. In an embodiment of the present invention, the contacts 340 are bi-layer contacts including a thin adhesion layer 342 and a bulk metal 344 having a high conductivity such as illustrated in FIG. 3F. In an embodiment of the present invention, contacts 340 include a thin titanium (Ti) adhesion layer of less than 150Å and a gold (Au) bulk material 344. In an embodiment of the present invention, the contacts 340 do not include any alloyed metals or silicides (i.e., metal silicon alloy, such as nickel silicide and titanium silicide). In this way, the thermal budget can remain low and device performance reliability improved. Next, upper levels of metallization 350 can then be formed in contact with contacts 340 to electrically couple the fabricated transistor with other transistors into functional circuits.

This completes the fabrication of a field effect transistor having source and drain regions formed from a narrow bandgap semiconductor.

Figure 6:
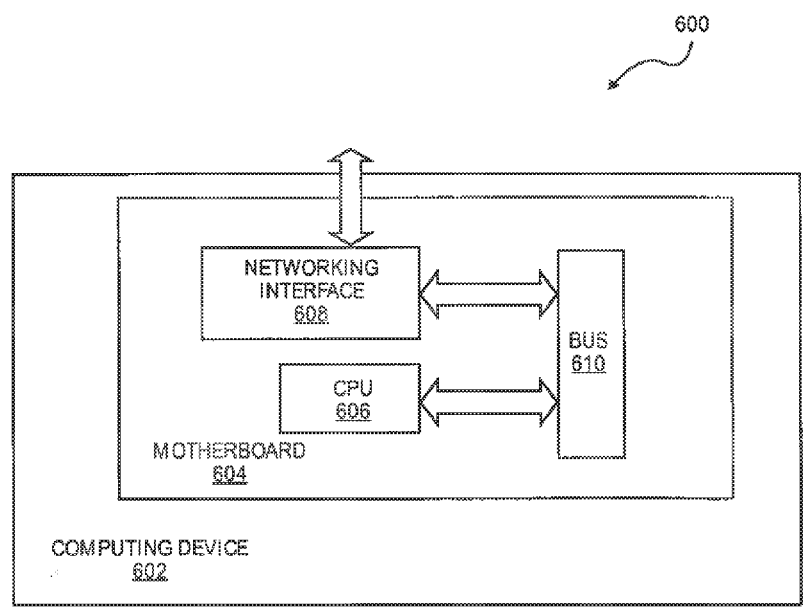
FIG. 6 illustrates a system in accordance with one embodiment.

FIG. 6 illustrates a system 600 in accordance with one embodiment. As illustrated, for the embodiment, system 600 includes computing device 602 for processing data. Computing device 602 may include a motherboard 604. Motherboard 604 may include in particular a processor 606, and a networking interface 608 coupled to a bus 610. More specifically, processor 606 may comprise the device 200 or 500 that has the earlier described narrow bandgap source and drain regions.

Depending on the applications, system 600 may include other components, including but are not limited to volatile and non-volatile memory, a graphics processor, a digital signal processor, a crypto processor, a chipset, mass storage (such as hard disk, compact disk (CD), digital versatile disk (DVD) and so forth), and so forth. One or more of these components may also include the earlier described narrow bandgap source and drain regions.

In various embodiments, system 600 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

What is claimed is:
1. A transistor comprising:
a gate dielectric layer formed over a substrate;
a gate electrode formed on the gate dielectric layer; and
a pair of source/drain regions on opposite sides of the gate electrode, the pair of source/drain regions comprising a doped semiconductor film that extends directly beneath the gate electrode, wherein the semiconductor film comprises a material selected from the group consisting of InSb, InAs, InP and InGaAs; and wherein the semiconductor film is doped to a p type conductivity with a carbon (C), a cadmium (Cd), a zinc (Zn), or a chromium (Cr) dopant.
2. The transistor of claim 1, wherein the semiconductor film comprises InAs.
3. The transistor of claim 1, further comprising a pair of non-alloyed ohmic contacts directly on the semiconductor film on opposite sides of the gate electrode.
4. The transistor of claim 3, wherein at least one of the non-alloyed ohmic contacts comprises a gold layer on a titanium layer.
5. The transistor of claim 1, wherein the doped semiconductor film extends beneath at least a portion of the gate electrode.
6. The transistor of claim 1, wherein the semiconductor film is formed in a pair of recesses in the substrate on opposite sides of the gate electrode.
7. The transistor of claim 1, wherein the substrate comprises a buried oxide layer.
8. The transistor of claim 7, wherein the buried oxide layer has a thickness between 200-2,000 angstroms.
9. The transistor of claim 1, wherein the semiconductor film is doped with a concentration level between $1 \times 10^{16}$-$1 \times 10^{19}$ atoms/cm$^3$ of the Si dopant.
10. The transistor of claim 1, wherein the gate dielectric layer comprises at least one of tantalum pentaoxide, titanium oxide, hafnium oxide, zirconium oxide, aluminum oxide, lead zirconium titanate (PZT), or barium strontium titanate (BST).

11. A transistor comprising:
- a substrate comprising a body having a top surface opposite a bottom surface and a pair of sidewalls;
- a gate dielectric layer on the body along the top surface and the pair of sidewalls of the body;
- a gate electrode on the gate dielectric layer along the top surface and the pair of sidewalls of the body; and
- a pair of non-planar source/drain regions on the body on opposite sides of the gate electrode, the pair of non-planar source/drain regions comprising an in situ doped semiconductor film comprising a material selected from the group consisting of InSb, InAs, InP and InGaAs that extends directly beneath at least a portion of the gate electrode, wherein the semiconductor film is doped to a p type conductivity with a carbon (C), a cadmium (Cd), a zinc (Zn), or a chromium (Cr) dopant.

12. The transistor of claim 11, wherein the semiconductor film comprises InAs.

13. The transistor of claim 11, further comprising a pair of non-alloyed metal contacts directly on the semiconductor film on opposite sides of the gate electrode.

14. The transistor of claim 11, wherein the semiconductor film extends above the top surface.

15. The transistor of claim 11, wherein the substrate comprises a buried oxide layer.

16. The transistor of claim 11, wherein the semiconductor film is formed in a pair of recesses in the body on opposite sides of the gate electrode.

17. The transistor of claim 15, wherein the body is on the buried oxide layer.

18. The transistor of claim 15, wherein the buried oxide layer has a thickness between 200-2,000 angstroms.

19. The transistor of claim 11, wherein the semiconductor film is doped with a concentration level between $1 \times 10^{16}$-$1 \times 10^{19}$ atoms/cm$^3$ of the Si dopant.

20. The transistor of claim 11, wherein the gate dielectric layer comprises at least one of tantalum pentaoxide, titanium oxide, hafnium oxide, zirconium oxide, aluminum oxide, lead zirconium titanate (PZT), or barium strontium titanate (BST).

* * * * *